United States Patent [19]

Feinstein

[11] Patent Number: 4,692,120

[45] Date of Patent: Sep. 8, 1987

[54] ELECTRONIC CARD FOR SHARING THE SAME EDGEBOARD CONNECTOR WITH ANOTHER ELECTRONIC EDGEBOARD

[76] Inventor: David Y. Feinstein, 7722 Fawn Ter., Houston, Tex. 77071

[21] Appl. No.: 914,452

[22] Filed: Oct. 1, 1986

[51] Int. Cl.⁴ .......................................... H01R 23/72
[52] U.S. Cl. .................................... 439/62; 29/758; 439/65
[58] Field of Search ............ 339/17 L, 17 M, 17 LM, 339/17 C, 17 R, 176 MP; 29/758

[56] References Cited

U.S. PATENT DOCUMENTS 4,232,924 11/1980 Kline et al. ..................... 339/17 L Primary Examiner—Neil Abrams

[57] ABSTRACT

An electronic card which can share the same edgeboard connector with another electronic edgeboard. A hole having a shape and dimensions corresponding to the top surface of the edgeboard connectors and special contact means allow the mounting of the electronic card in a horizontal plane around the edge connector. The special contacts are inserted in an empty space between the contacts and the inner surface of the edgeboard connectors so that the edgeboard connector can still accept regular edgeboard. The electronic card may be connected to only one said of the edgeboard connector, or it can be simultaneously connected to several edgeboard connectors. A tool for fast insertion of the electronic card is also disclosed.

15 Claims, 9 Drawing Figures

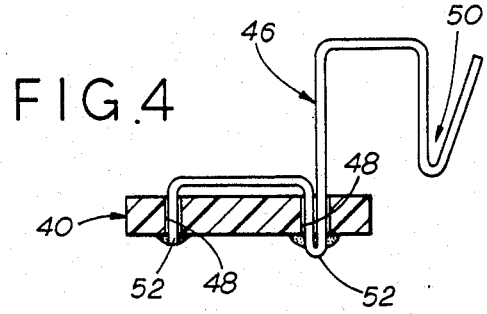
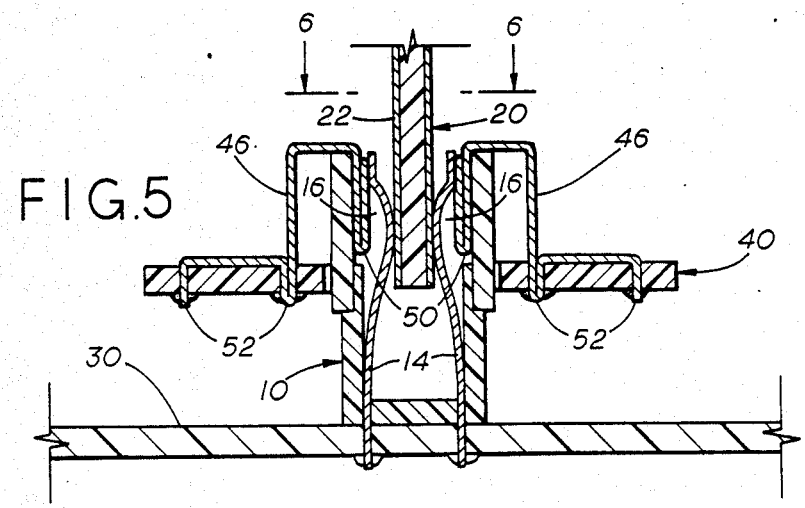
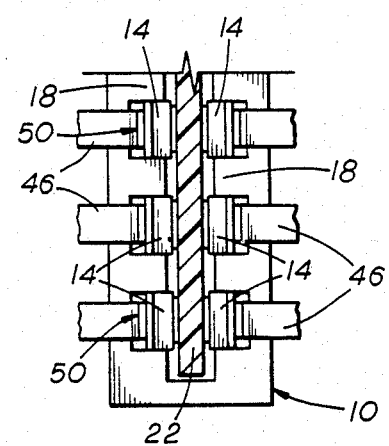

ELECTRONIC CARD FOR SHARING THE SAME EDGEBOARD CONNECTOR WITH ANOTHER ELECTRONIC EDGEBOARD

BACKGROUND OF THE INVENTION

1. Field of the Invention

This invention relates to an electronic card which is capable of being connected as a second card on an edgeboard connector which carries a regular electronic edgeboard.

2. Description of the Prior Art

The connection of two electronic cards by an edgeboard connector is known to the art and it extensively used in many applications. Using this method, one electronic card, called the main board, has an edgeboard connector mounted on it, usually by soldering. The other electronic card, which is the edgeboard, has a tab (edge) with a set of parallel printed strip conductors that corresponds to the layout of the contacts of the edgeboard connector. The two card are easily connected together by simply inserting the tab of the edgeboard into the edgeboard connector. Therefore, the edgeboard connector provides an excellent mechanical and electrical interface between the two cards with the advantage of easy mating and removal.

In some applications there is a need to interface several edgeboards into one main board. The trivial prior art solution is to mount several edgeboard connectors on the main board to accommodate all the edgeboards. It is evident that once a main board is built, the number of edgeboard connectors constitutes the maximum number of possible edgeboards that can be simultaneously interfaced. In applications like computers, where more cards can be used on the main board than the existing number of edgeboard connectors, this turned out to be a major disadvantage of the prior art. In other applications, the main board has a space limitation which constitutes a limit on the number of edgeboard connectors that can be placed on the main board. Thus less edgeboards can be used.

BRIEF DESCRIPTION OF THE INVENTION

The present invention overcomes the disadvantage of the prior art by allowing two electronic cards to share the same edge connectors. One electronic card is the regular electronic edgeboard which is inserted into the edgeboard connector in the usual manner. The second electronic card is designed to be connected horizontally around or just above the top surface of the edgeboard connector. The second card has a rectangular hole to allow the insertion of the standard edgeboard into the edgeboard connector, with contacts entering the edgeboard connector without interfering with the inserted edgeboard.

It is, therefore, the primary object of the present invention to provide a secondary electronic card that can share the same edgeboard connector with a regular electronic edgeboard.

It is also the object of the present invention to improve the utilization of the space around an edgeboard connectors.

It is another object of the present invention to provide a secondary electronic card which produces a strong mechanical mounting and a reliable electrical contacts with the edgeboard connector.

It is yet another object of the present invention to provide a secondary electronic card which is either installed or removed from the edgeboard connector within seconds by nontechnical personnel.

It is a further object of the present invention to provide a secondary electronic card which can be easily manufactured by standard printed circuit board techniques and which contacts can be formed by automatic forming machines in a single manufacturing step.

With the above and other objects in view, the present invention will become more apparent when taken in conjunction with the following description and attached drawings, wherein like characters indicate like parts, and which drawings form a part of the present invention.

BRIEF DESCRIPTION OF THE DRAWINGS

FIG. 4 is a cross section view taken along line 4—4 of FIG. 3 illustrating the profile of the preferred embodiment of the contact means used to connect the electronic card and the edgeboard connector.

FIG. 5 is a cross section view of an edgeboard connector carrying the electronic edgeboard and the electronic card of FIG. 2.

FIG. 6 is a partial cross section view taken generally along line 6—6 in FIG. 5.

DETAILED DESCRIPTION OF THE PREFERRED EMBODIMENT

Figure 1:
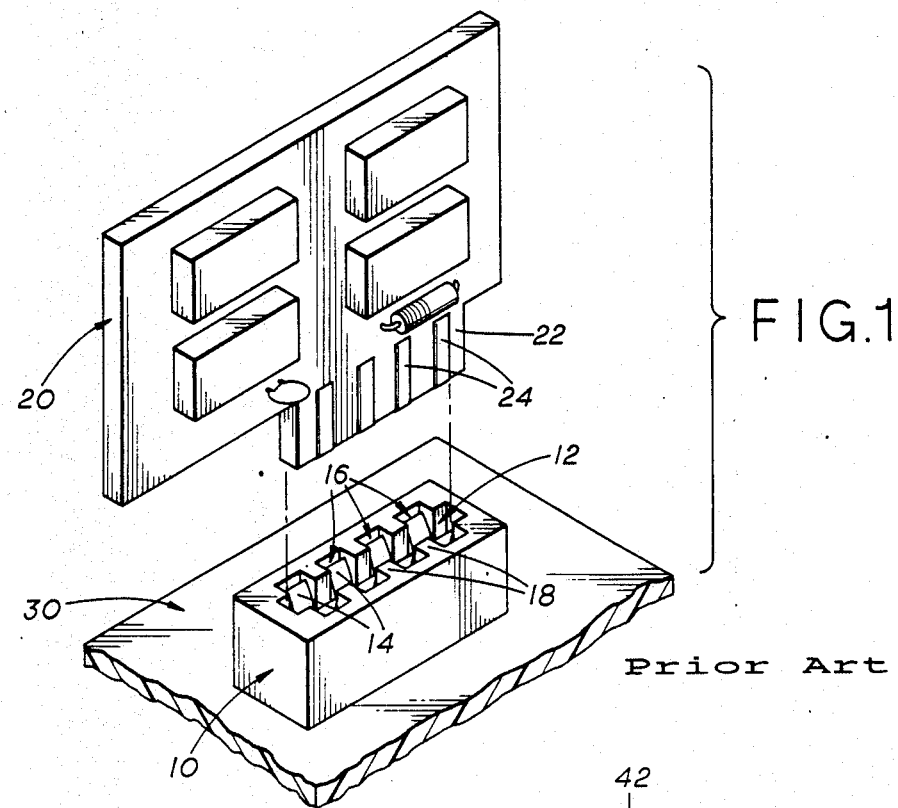
FIG. 1 illustrates a perspective view of a simple edgeboard connector and an electronic edgeboard of the prior art.

Now with more particular reference to the drawings, FIG. 1 illustrates a simple 8 contacts edgeboard connector 10 and an electronic edgeboard 20 of the prior art. The electronic edgeboard 20 is also called an "expansion card", a "plug-in card", or just an "electronic card". The edgeboard connector 10 is mounted on a printed circuit board 30 or on another electronic carrying module, which is called "main board", "motherboard", "base board", or a "system board". The electronic edgeboard 20 has a tab 22 with a plurality of parallel strips of PCB (Printed Circuit Board) contacts 24 that are evenly spaced in a vertical arrangement along the tab 22. The tab 22 is inserted into a hollow space 12 along the edgeboard connector center. The edgeboard connector 10 has a plurality of contacts 14 which are evenly spaced along the hollow space 12. The number of the PCB contacts 24 as well as their spacing correspond to the number and the spacing of the edgeboard connector contacts 14. Between each adjacent pair of the contacts 14 there is a boundary partition 18 which prevents accidental electrical contact between adjacent contacts. Between each contact 14 and the internal surface of the edgeboard connector there is an empty space 16 which allows some extra room for the contacts when the edgeboard 20 is inserted. In a typical edgeboard connector with 0.100" spacing between adjacent contacts, the empty space 16 has a length of 0.060" when the edgeboard connector is empty. When the edgeboard 20 is inserted, the empty space 16 length is shortened to about 0.020". The width of the empty space 16 in such a typical edgeboard connector is 0.060"–0.070" and its depth is about 0.300". The foregoing arrangement of the edgeboard and the edgeboard connector provides an excellent electrical contact between each PCB contact 24 and the corresponding edge connector contact 14.

Figure 2:
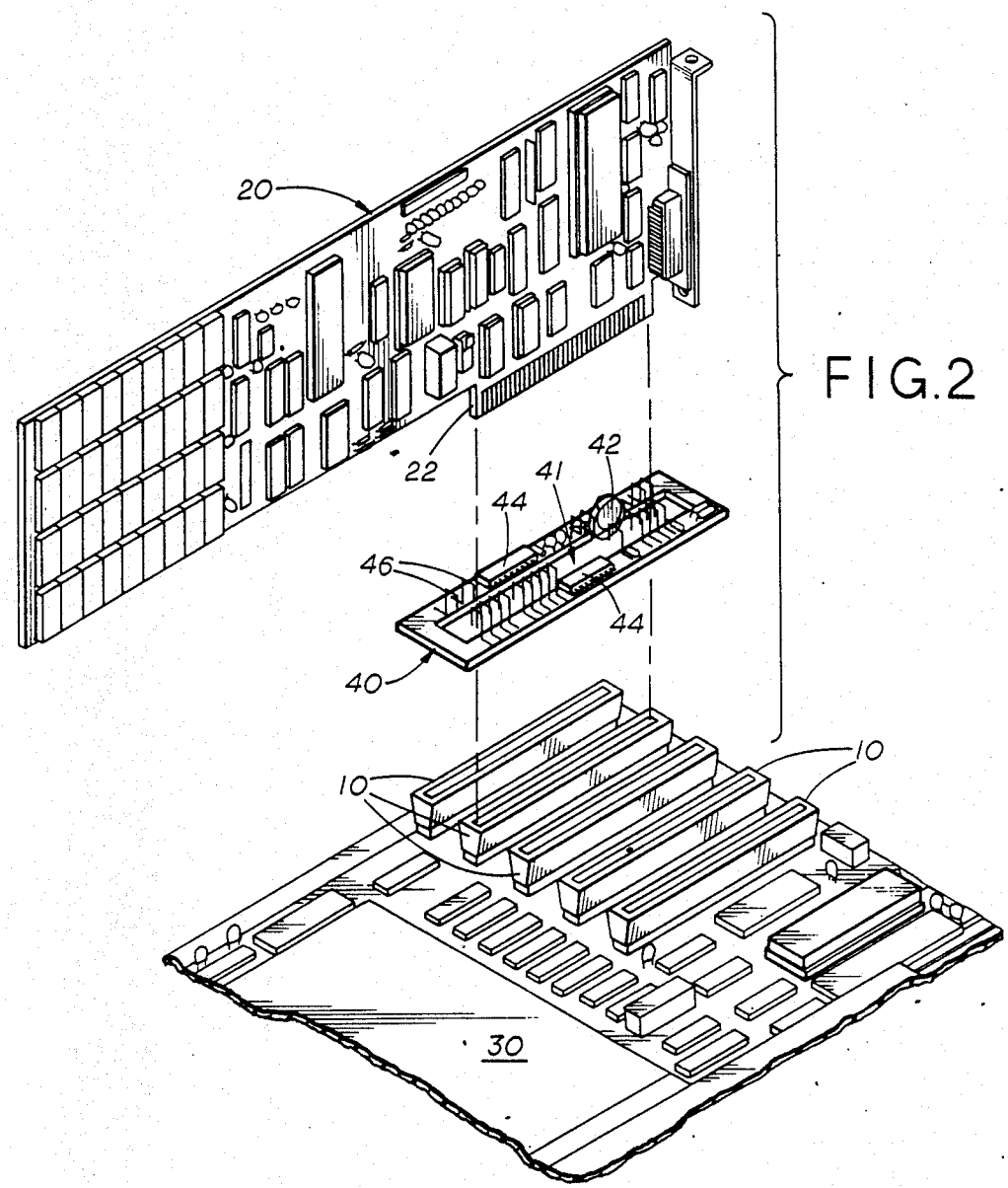
FIG. 2 is an overall perspective view of an electronic card for sharing the same edgeboard connector with another electronic edgeboard, made in accordance with the present invention.

FIG. 2 is an overall perspective view of an electronic card 40 which shares the same edgeboard connector with another electronic edgeboard, made in accordance with the present invention, showing the spatial relation of said electronic card 40 to the edgeboard connector 10 and the electronic edgeboard 20. The drawing depicts a particular embodiment of the present invention as a clock/calendar card for the IBM-PC computer. The electronic card 40 has a variety of circuits and components like a lithium battery 42 and integrated circuits 44 used for its particular application. A rectangular hole 41 with dimensions corresponding to the outer dimensions of the edge connector 10 allows horizontal mounting of the electronic card 40 around the edgeboard connector 10. As a result, the electronic edgeboard 20 can be inserted into the edge connector even when the electronic card 40 is mounted. Special contact means 46 of the electronic card 40 are inserted into the corresponding empty space 16 of the edge connector 10 to provide electrical contact as well as mechanical support for the side card 40. While it is economical and convenient to use the contact means for mechanical support, it is of course, possible to support the electronic card with other mechanical means like legs, frames, springs and the like.

Figure 3:
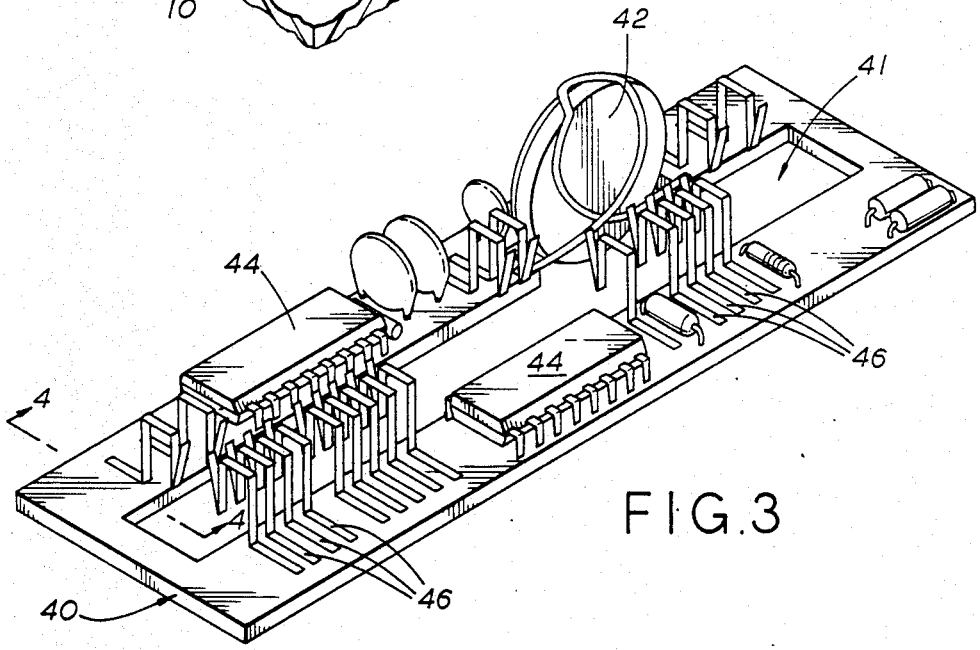
FIG. 3 is a more detailed perspective view of the electronic card of FIG. 2.

FIG. 3 is a more detailed perspective view of the electronic card 40 of FIG. 2. While the particular embodiment is designed to be used on the IBM-PC edgeboard connectors which have 62 contacts in each, the various circuits of the electronic card 40 need electrical connections to only 20 contacts, and therefore only 20 contact means 46 are used. To accommodate the short distance between adjacent edgeboard connectors of the IBM-PC, the electronic card 40 is extremely narrow. In other application where more room is available around the edgeboard connector, a wider electronic card 40 may be used.

FIG. 4 is a cross section view taken along line 4—4 of FIG. 3, illustrating the profile of the contact means 46 used to connect the electronic card 40 and the edgeboard connector 10. The contact means 46 is made from a ribbon strip metal bent to a form having a "V" shaped 50 insertion section and two PCB mounting legs 52. Two holes 48 in the electronic card 40 accommodate the two legs 52 of the contact 46. The two legs 52 are used to insure correct orientation of the contact means 46 so that it will be at exactly 90 degrees to the edgeboard connector length when the electronic card 40 is connected to the edgeboard connector. The "V" shaped section 50 of the contact is the actual part that is inserted into the empty space 16 of the edge connector 10.

For this particular application where the electronic card 40 is to be inserted into edgeboard connector with 0.10 spacing, the contacts 46 are made from a ribbon strip of 0.050 (width) by 0.010 (thick) Beryllium Copper, ¼ hard. The contact means 46 is fully plated by tin or other low-cost electrical coating, with an optional gold selective plating on the actual contact area of the "V" shaped section 50. The strip is formed by a FOUR-SLIDE automatic forming machines in accordance with the shape in the drawing. In general, the contact means 46 can be formed in many other shapes, as long as stable orientation and good electrical contacts are insured. In particular, progressive stamping can be used to create more intricate contacts. The shape in FIG. 4 was selected after numerous experiments since it was easy to form by the relatively low cost manufacturing process using the automatic FOUR-SLIDE (or MULTI-SLIDE) machines and it provides excellent mechanical and electrical interface to the edgeboard connector. The ¼ hard material was chosen as the optimum spring hardness for easy insertion into the empty spaces 16 of the edgeboard connector 10. Other Copper alloys with resilient properties may be used instead of the low-cost Beryllium Copper.

FIG. 5 is a cross section view of an edgeboard connector 10 carrying an electronic edgeboard 20 and the electronic card 40 of FIG. 2. The electronic card 40 is parallel to the main board 30 and it is in a plane which is vertical to the plane of the edgeboard 20. The "V" shaped sections 50 of the contact means 46 are plugged into the empty space 16 defined between the edgeboard connector contacts 14 and the inner surface of the edgeboard connector. The resilient properties of the contact means material provide excellent electrical connection between contacts 14 and 46, even when the edgeboard 20 is removed. The connections between contacts 22 of the edgeboard 20 and the contacts 14 of the edgeboard connector 10 are not impaired by the contacts 46 of the electronic card 40.

FIG. 6 is a partial cross section view taken generally along line 6—6 in FIG. 5. The contacts 46 must be vertical to the length of the edgeboard connector 10 in order to insure easy insertion of the "V" shaped sections 50 into the empty spaces 16. It is possible to use contacts 46 with only flat strips instead of the "V" shaped sections that are inserted between contacts 22 of the edgeboard 20 and contacts 14 of the edgeboard connector. However, such a solution is inferior to the use of the empty spaces 16 since they require that the edgeboard must be always inserted to insure good contacts. Further, the empty spaces 16 are useful for mechanical and electrical isolation between adjacent contacts means 46.

Figure 7:
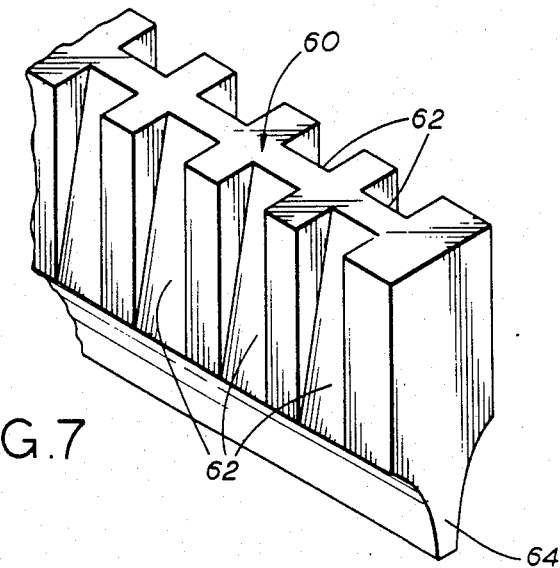
FIG. 7 illustrates a perspective view of a tool for fast insertion of the electronic card of FIG. 2 into the edgeboard connector.

FIG. 7 illustrates a perspective view of a tool 60 for fast insertion of the electronic card 40 of FIG. 2 into the edgeboard connector 10. The lower part 64 of the tool 60 has an elongated wedge shape so that it can be snapped into the hollow space 12 of the edgeboard connector 10. The tool 60 has a plurality of parallel slanted grooves 62 which are designed to be aligned with the opening of the empty spaces 16 of the edgeboard connector 10. Thus the slanted grooves 62 accept the contact means 46 of the electronic card 40 and they act as a guidance path for fast insertion. The tool 60 can be made inexpensively from a variety of plastic or even metal molds. In most applications, the electronic card 40 will be easily installed into the edgeboard connector 10 without the tool 60. The tool 60 will be used only in applications where the small dimensions require a delicate guidance for the insertion of the contact means 46.

Figure 9:
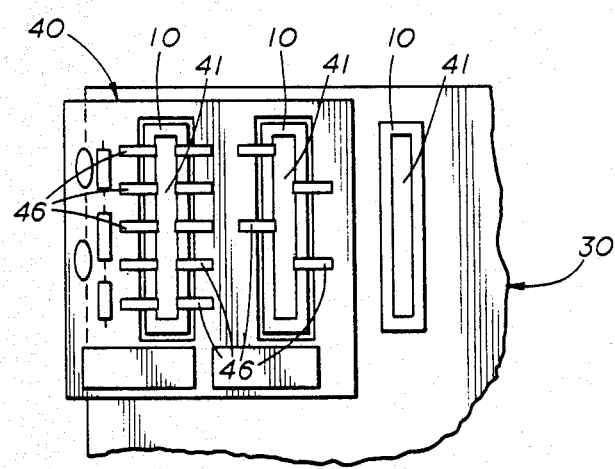
FIG. 9 is a schematic top view of an electronic card which simultaneously shares at least two edgeboard connectors with electronic edgeboards.
Figure 8:
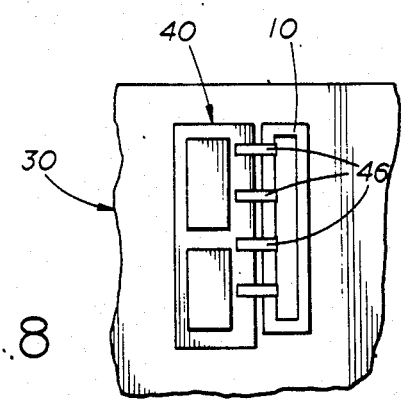
FIG. 8 is a schematic top view of an electronic card for sharing the same edgeboard connector with another electronic edgeboard which is connected to only one side of the edgeboard connector.

FIG. 8 and FIG. 9 illustrates some variations of the present invention. FIG. 8 is a schematic top view of an electronic card 40 which shares the same edgeboard connector 10 with another electronic edgeboard, whereby the electronic card is connected only to one side of the edgeboard connector using a plurality of contact means 46. Such application of the present invention is possible when all the necessary connections to the edgeboard connector 10 are available on one side of the edgeboard connector. In other applications, the electronic card 40 may have a different shape with physical connection to only selected parts of both sides of the connector 10. FIG. 9 is a schematic top view of an electronic card 40 which simultaneously shares at least two edgeboard connectors 10 with electronic edgeboards. Such application of the present invention may be useful on main boards with different wiring for each edgeboard connector.

While there is shown and described herein certain specific structures embodying the invention, it will be manifest to those skilled in the art that various modifications and rearrangements of the parts may be made without departing from the spirit and scope of the underlying inventive concept and the same is not limited to the particular forms herein shown and described except insofar as indicated by the scope of the appended claims.

I claim:

1. An electronic card for sharing the same edgeboard connector with an electronic edgeboard that is to be inserted into the edgeboard connector, wherein said electronic card has a hole with a shape and dimensions matching the outer surface of said edge connector, and wherein said electronic card is further equipped with a plurality of contact means for electrically connecting the various circuits of said electronic card with the contacts of said edgeboard connector, said electronic card is mechanically supported by said contact means around said edgeboard connector in a plane perpendicular to the plane of said electronic edgeboard so that said electronic edgeboard can be inserted into said edgeboard connector through said hole of said electronic card.

2. An electronic card for sharing the same edgeboard connector with an electronic edgeboard as recited in claim 1, wherein said contacts and an inner surface of said edgeboard connector are separated by an empty space into which said contacts are being pushed when said electronic edgeboard is inserted into said edgeboard connector, and wherein said contact means of said electronic card have a resilient section which is inserted into said empty space.

3. An electronic card for sharing the same edgeboard connector with an electronic edgeboard as recited in claim 2, wherein said resilient section of said contact means is made by forming a relatively thin strip of a spring metal into a "V" shaped section with dimensions small enough for insertion into said empty space.

4. An electronic card for sharing the same edgeboard connector with an electronic edgeboard as recited in claim 2, wherein said contact means having at least two legs, and wherein said electronic card has corresponding holes to accept said legs so that said contact means is perpendicularly oriented relative to the length of said edgeboard connector.

5. An electronic card for sharing the same edgeboard connector with an electronic edgeboard as recited in claim 2, wherein said contact means are made of a ¼ hard Beryllium Copper ribbon strip having a width of 0.050" and thickness of 0.010", said ribbon strip is formed by an automatic FOUR-SLIDE machine.

6. An electronic card for sharing the same edgeboard connector with an electronic edgeboard as recited in claim 1, wherein said contact means is plated with a material having good electrical conducting properties.

7. An insertion tool for an electronic card for sharing the same edgeboard connector with an electronic edgeboard that is to be inserted into the edgeboard connector, said electronic card having "V" shaped contact means for insertion into said edgeboard connector, the contacts and the inner surface of said edgeboard connector being separated by an empty space into which said contacts are being pushed when said electronic edgeboard is inserted into said edgeboard connector, said tool comprising:

a body with a length corresponding to the length of said edgeboard connector;

a narrow bottom portion adapted to be inserted into the empty space along the center of said edgeboard connector; and said body having a plurality of slanted grooves in locations corresponding to the locations of the contacts of said edgeboard connector, said slanted grooves are adapted to guide said "V" shaped contacts means into said empty spaces.

8. An electronic card for sharing the same edgeboard connector with an electronic edgeboard that is to be inserted into the edgeboard connector comprising:

a body carrying a plurality of circuits and electronic components, said body having at least one relatively straight edge;

a plurality of contact means for electrically connecting said circuits of said electronic card with the contacts of said edgeboard connector, said electronic card is mechanically supported by said contact means along one side of said edgeboard connector in a plane perpendicular to the plane of said electronic edgeboard when the electronic edgeboard is inserted into the edgeboard connector.

9. An electronic card for sharing the same edgeboard connector with an electronic edgeboard as recited in claim 8, wherein said contacts and the inner surface of said edgeboard connector are separated by an empty space into which said contacts are being pushed when said electronic edgeboard is inserted into said edgeboard connector, and wherein said contact means of said electronic card having a resilient section which is inserted into said empty space.

10. An electronic card for sharing the same edgeboard connector with an electronic edgeboard as recited in claim 9, wherein said resilient section of said contact means is made by forming a relatively thin strip of a spring metal into a "V" shaped section with dimensions small enough for insertion into said empty space.

11. An electronic card for sharing the same edgeboard connections with an electronic edgeboard as recited in claim 9, wherein said contact means is having at least two legs, and wherein said electronic card has corresponding holes to accept said legs so that said contact means is perpendicularly oriented relative to the length of said edgeboard connector.

12. An electronic card for simultaneously sharing at least two edgeboard connectors with electronic edgeboards that are to be inserted into the edgeboard connectors, wherein said electronic card has a number of holes equal to the number of said edgeboard connectors, said holes having a shape and dimensions matching the outer surfaces of said edge connectors, and wherein said electronic card is further equipped with a plurality of contact means for electrically connecting the various circuits of said electronic card with the contacts of said edgeboard connectors, said electronic card is mechanically supported by said contact means around said edgeboard connectors in a plane perpendicular to the plane of said electronic edgeboards so that said electronic edgeboards can be inserted into said edgeboard connectors through said holes of said electronic card.

13. An electronic card for simultaneously sharing at least two edgeboard connectors with electronic edgeboards as recited in claim 12, wherein said contacts and inner surfaces of said edgeboard connectors are separated by an empty space into which said contacts are being pushed when said electronic edgeboards are inserted into said edgeboard connector, and wherein said contact means of said electronic card have a resilient section which is inserted into said empty space.

14. An electronic card for simultaneously sharing at least two edgeboard connectors with electronic edgeboards as recited in claim 13, wherein said resilient section of said contact means is made by forming a relatively thin strip of a spring metal into a "V" shaped section with dimensions small enough for insertion into said empty space.

15. An electronic card for simultaneously sharing at least two edgeboard connectors with electronic edgeboards as recited in claim 13, wherein said contact means is having at least two legs, and wherein said electronic card has corresponding holes to accept said legs so that said contact means is perpendicularly oriented relative to the length of said edgeboard connectors.

* * * * *